United States Patent [19]
Mitsushima et al.

[11] Patent Number: 5,730,317
[45] Date of Patent: Mar. 24, 1998

[54] STRUCTURE OF CHIP COMPONENT FEEDER

[75] Inventors: Takatoshi Mitsushima, Nara; Kunio Tanaka; Tomitatsu Soga, both of Osaka; Takashi Nakanishi, Ashiya; Takashi Matsushima; Manabu Morita, both of Osaka, all of Japan

[73] Assignee: Matsushita Electric Industrial Co., Ltd., Osaka, Japan

[21] Appl. No.: 490,709

[22] Filed: Jun. 15, 1995

[30] Foreign Application Priority Data

Jun. 15, 1994 [JP] Japan ................................. 6-132972
Jan. 12, 1995 [JP] Japan ................................. 7-003252

[51] Int. Cl.⁶ .................................................. B65G 59/00
[52] U.S. Cl. .......................... 221/131; 221/236; 221/263; 221/268
[58] Field of Search .................. 221/263, 268, 221/224, 236, 202, 266, 131

[56] References Cited

U.S. PATENT DOCUMENTS

| | | |
|---|---|---|
| 4,459,743 | 7/1984 | Watanabe et al. . |
| 4,735,354 | 4/1988 | Yagi et al. . |
| 4,905,445 | 3/1990 | Saitoh et al. . |
| 5,014,876 | 5/1991 | Young et al. ............... 221/266 |
| 5,336,469 | 8/1994 | Tobiki et al. ............... 221/266 |
| 5,590,814 | 1/1997 | Prospero et al. ........... 221/266 |

FOREIGN PATENT DOCUMENTS

| | | | |
|---|---|---|---|
| 0452038 | 10/1991 | European Pat. Off. . | |
| 484224 | 5/1992 | European Pat. Off. ........ | 221/202 |
| 2828062 | 1/1980 | Germany ...................... | 221/263 |
| 2244481 | 12/1991 | United Kingdom . | |
| 2244482 | 12/1991 | United Kingdom ........... | 221/202 |

*Primary Examiner*—H. Grant Skaggs
*Attorney, Agent, or Firm*—Pollock, Vande Sande & Priddy

[57] ABSTRACT

A chip component feeder is provided which includes a chip component storage box, a pick-up slider, a first feeding unit, and a second feeding unit. The pick-up slider slides to enter an outlet of the chip component storage box for picking up chip components and leads them to a feeding path formed in the first feeding unit communicating with the second feeding unit. The feeding path of the first feeding unit has a rectangular cross section suitable for the chip components of rectangular shape as well as square or circular shape.

20 Claims, 12 Drawing Sheets

FIG. 29
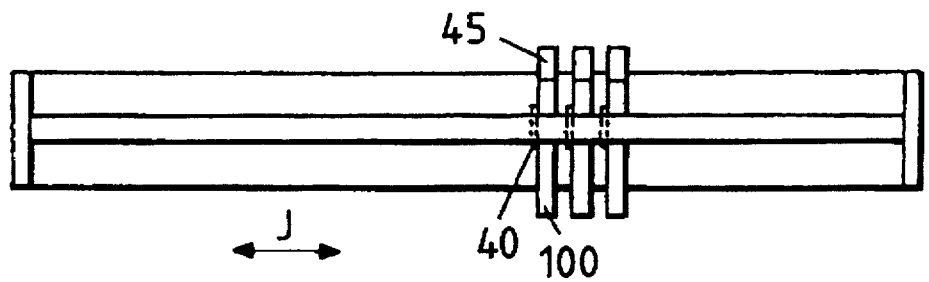
FIG. 30
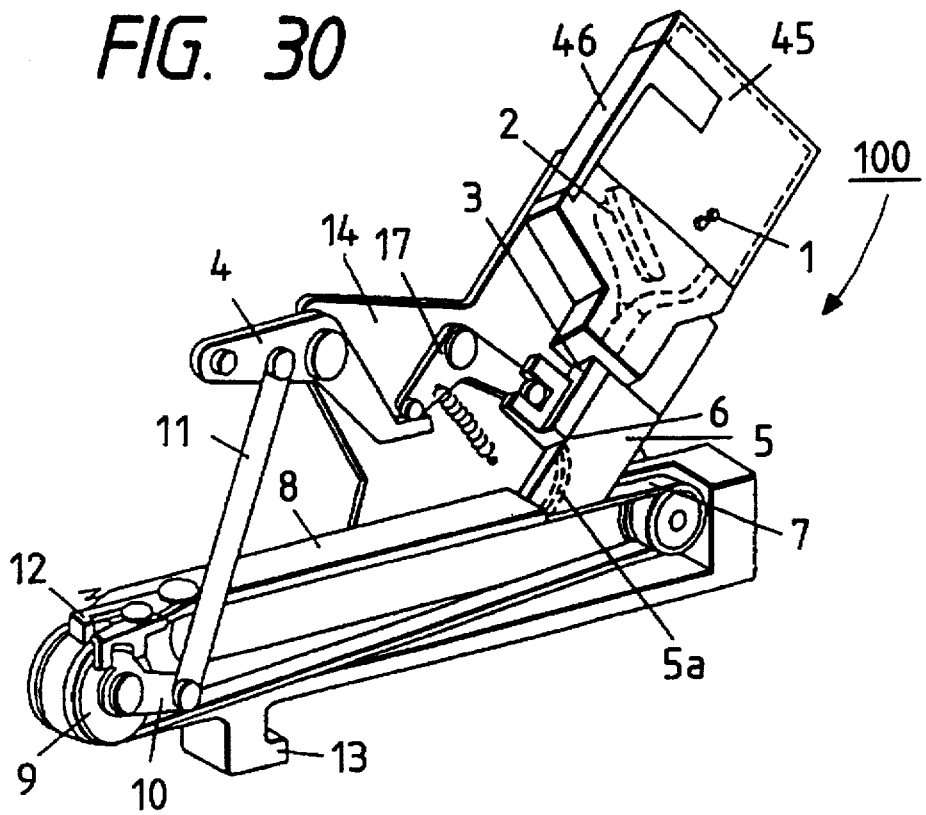
FIG. 31(a) FIG. 31(b) FIG. 31(c)
1a
1b
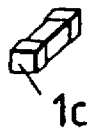
1c

STRUCTURE OF CHIP COMPONENT FEEDER

BACKGROUND OF THE INVENTION

1. Technical Field

The present invention relates generally to an electronic component feeding apparatus, and more particularly to an improved structure of a chip component feeding apparatus designed to pick up chip components stored in a storage box.

2. Background Art

FIG. 32 shows an example of a conventional chip component feeder which is designed to sequentially supply discrete electronic components such as chips 1a, 1b; or 1c, as shown in FIGS. 31(a) to 31(c), (hereinafter, referred to as chip components 1) to an electronic component mounting machine (not shown). The arrangement of the chip components 1 in the chip component feeder is accomplished by moving up and down the component pick-up pipe 48 inserted into a storage box 47 to drop the chip components 1 stored therein, in sequence, into a component feeding pipe 50. The chip components 1 are in turn placed on a belt 52 traveling beneath a terminal portion of the component feeding pipe 50, and fed in a direction indicated by an arrow B while being guided by a cover 53 mounted above an upper surface of the belt 53. When reaching an end of the belt 53, the chip components 1 are stopped by a stopper 57 in place.

The picking up the chip components 1 from the storage box 47 is achieved by moving an operating lever 49a in a direction indicated by an arrow A through the electronic component mounting machine to swing the component pick-up pipe 48 vertically within the storage box 47 through a lever 49b. Additionally, the movement of the operating lever 49a causes a ratchet 55 and a ratchet wheel 51 to rotate intermittently through a connecting lever 56a to move the belt 52 and also causes the stopper 57 to be displaced through connecting levers 49c and 56b. These operations complete one cycle of sequential chip component picking up operations.

The above conventional chip component feeder, however, encounters the following drawback.

It is possible to pick up the chip components 1 having a circular or square cross section, as shown in FIG. 31(a) or 31(c), out of the storage box 47 through the component pick-up pipe 48 and feed them through the component feeding pipe 50 regardless of orientation of the chip components if rotated about 360 deg, as seen from FIG. 33(a) or 33(c). Particularly, when the cylindrical chip components shown in FIG. 31(a) are fed, the component feeding pipe 50 may be increased in size up to twice the diameter of the chip components 1 for ensuring a sufficient supply of the chip components 1. The increasing diameter of the component feeding pipe 50, however, may cause the chip components 1, especially if they have a rectangular cross section, as shown in FIG. 33(b), to overlap with each other so that they are not placed separately on the belt 52.

SUMMARY OF THE INVENTION

It is therefore a principal object of the present invention to avoid the disadvantages of the prior art.

It is another object of the present invention to provide an improved structure of a chip component feeder which is designed to separately feed the electronic component, if having a rectangular cross section, to a pick-up station at high speeds.

According to one aspect of the present invention, there is provided a chip component feeding apparatus which comprises (a) a storage member having formed therein a storage chamber for storing therein chip components, the storage chamber having an outlet formed in a lower portion thereof, (b) a first feeding unit having formed therein a feeding path for feeding the chip components stored in the storage chamber of the storage means, the feeding path having a rectangular cross section, (c) a pick-up slider sliding between an upper limit leading to the outlet of the storage member and a lower limit along a given sliding path defined on the first feeding unit to pick up the chip components stored in the storage chamber of the storage member for leading the picked up chip components into the feeding path of the first feeding unit, and (d) a second feeding unit for feeding the chip components fed through the feeding path of the first feeding unit to a pick-up station.

In the preferred mode of the invention, the storage member is geometrically oriented to lead the chip components to the outlet.

The feeding path of the first feeding unit is sized to prevent the more than two chip components from being inserted thereinto while overlapping with each other.

The height of the feeding path is less than twice the thickness of the chip components.

A partition member is further provided within the storage member to define a space over the outlet for preventing the weight of the chip components in an upper portion of the storage chamber from acting directly on the chip components around the outlet.

A drive unit is further provided which connects with the pick-up slider and the second feeding unit. The drive unit synchronously drives the pick-up slider along the given sliding path and the second feeding path to feed the chip components to the pick-up station.

The pick-up slider has formed therein a groove connecting between the outlet of the storage member and the feeding path of the first feeding unit. The pick-up slider has an end portion entering the outlet of the storage member according to the sliding movement. The end portion has formed thereon a tapered surface defining a chip component inlet opening together with an end of the groove.

The pick-up slider has an end portion of which enters the outlet of the storage member according to the sliding movement of the pick-up slider and which is stepped to have a decreased thickness. The outlet of the storage member is sized to prevent the more than two chip components from being inserted thereinto while overlapping with each other.

The pick-up slider, when reaching the lower limit, defines an outlet chamber In the outlet of the storage member for dropping thereinto the chip components which are in a given position.

The pick-up slider has an end portion entering the outlet of the storage member according to the sliding movement. The end portion may be flush with an inner wall of the storage chamber around the outlet when the pick-up slider reaches the lower limit.

A protrusion is further formed on the given sliding path of the pick-up slider for preventing the chip components from being locked in the given sliding path.

The pick-up slider is formed with a square member having a given length. The groove may be formed in a first corner portion of the square member, and a chamfered or rounded portion may be formed on a second corner portion opposite the first corner portion.

The pick-up slider includes a base member, a sliding member, and a spring, the sliding member being slidably mounted on the base member and spring-loaded by the spring.

The feeding path of the first feeding unit has a cross sectional area greater than a diagonal of the chip components having a substantially cubic shape, and has a flat bottom surface.

An extension is further formed on the sliding path of the pick-up slider which extends over the inlet of the feeding path to orient insertion of the chip components into the feeding path.

The drive unit includes a lever, a first intermediate lever connecting with the lever, and a second intermediate lever connecting with the first intermediate lever through a spring. The second intermediate lever connects at its end with the pick-up slider and is moved by the lever through the first intermediate lever and the spring.

A pick-up unit is further disposed at the pick-up station, the pick-up unit including a lever, a sliding member, and a stopper. The stopper is arranged to retain the chip components fed by the second feeding unit at the pick-up station and rotated by the sliding member according to movement of the lever to release the retaining of the chip components for providing access to the chip components.

According to another aspect of the invention, there is provided a chip component feeder moving assembly which comprises a plurality of chip component feeders, a base table mounting thereon the plurality of the chip component feeders, and a feeder holding member supported on the base table, the feeder holding member for holding the plurality of the chip component feeders side by side. Each of the chip component feeders includes (a) a storage member having formed therein a storage chamber for storing therein chip components and geometrically oriented to lead the chip components to an outlet formed in a lower portion of the storage member, (b) a first feeding unit having formed therein a feeding path having a rectangular cross section for feeding the chip components stored in the storage chamber of the storage means, (c) a pick-up slider sliding between an upper limit leading to the outlet of the storage member and a lower limit along a given sliding path defined on the first feeding unit to pick up the chip components stored in the storage chamber of the storage member for leading the picked up chip components into the feeding path of the first feeding unit, and (d) a second feeding unit for feeding the chip components fed through the feeding path of the first feeding unit to a pick-up station.

In the preferred mode of the invention, the feeder holding member includes a bar member having formed therein a plurality of grooves each retaining one of the chip component feeders.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for explanation and understanding only.

In the drawings:

FIG. 29 is a plan view of FIG. 28;

FIG. 30 is a perspective view which shows a modification of the chip component feeder in FIG. 28;

FIGS. 31(a), 31(b), and 31(c) are perspective views which show chip components of different types;

DESCRIPTION OF THE PREFERRED EMBODIMENT

Figure 1:
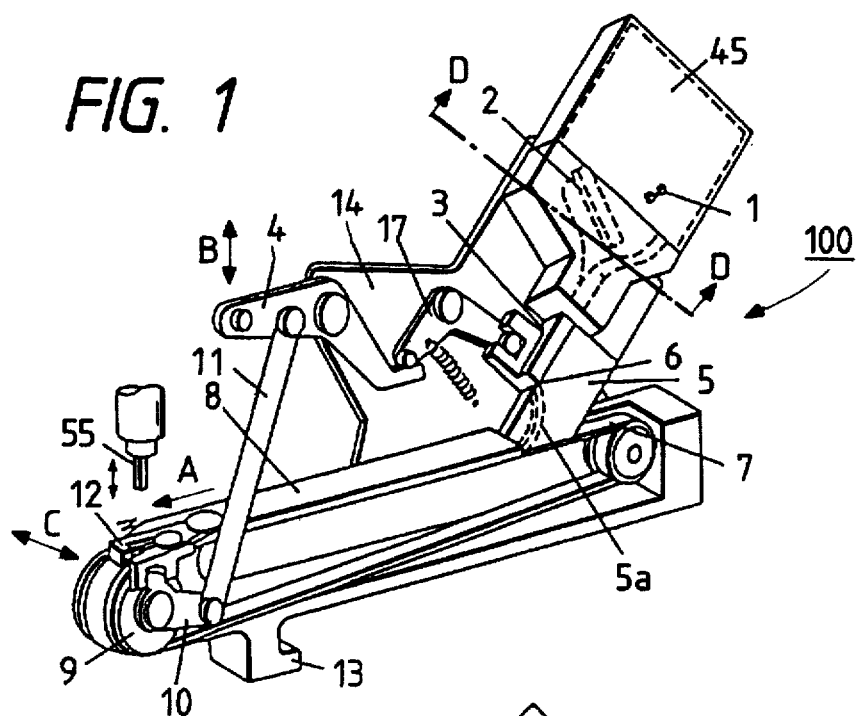
FIG. 1 is a perspective view which shows a chip component feeder according to the present invention.

Referring now to the drawings, wherein like reference numbers refer to like parts throughout several views, particularly to FIG. 1, there is shown a chip component feeder 100 according to the present invention.

A first storage box 45 storing therein chip components 1 is attached to a second storage box 2. The chip component 1 in the first storage box 45 are dropped into the second storage box 2 by opening a shutter (not shown). The first and second storage boxes 45 and 2 both have a storage chamber defined by the width W (see FIG. 6) more than three times longer than the length of the chip components 1 for preventing the more than two chip components from being locked therein. A pick-up slider 3 is formed with a square member having a given length. The pick-up slider 3 is inserted at its end into the second storage box 2 from the bottom, and driven to slide vertically so as to drop the chip components 1, in sequence, into a communication hole or feeding path 5a formed in a first feeding unit 5. The feeding path 5a has a rectangular cross section whose height is less than twice the thickness of the chip components 1 having a rectangular or square cross section. In other words, the feeding path 5a is sized to prevent the chip components 1 from entering while overlapping with each other. Additionally the cross sectional area of the feeding path 5a is set greater than a diagonal of the chip components having a substantially cubic shape for preventing these from being jammed in the feeding path 5a.

The chip components 1 dropped into the feeding path 5a are supplied to a belt 7 (i.e., a second feeding unit) arranged below an end of the feeding path 5a and then carried sequentially in a direction, as indicated by an arrow A, while being guided by a cover 8 mounted above an upper surface of the belt 7. For guiding the chip components 1 through the cover 8, it is advisable that more than one-half of the thickness of the chip components 1 be guided. The chip components 1 reaching the front end of the belt 7, i.e., pick-up station are stopped in place by a stopper 12.

The storage chamber of each of the first and second storage boxes 45 and 2, as can be seen in the drawings, are so geometrically oriented that the chip components 1 may be directed to an outlet 60 by their own weight or gravity. Particularly, a lower inner wall 69, as clearly shown in FIG. 4, of the second storage box 2 is curved so as to lead the chip components 1 into the outlet 60. Additionally, the second storage box 2 has a partition member 70 for defining a space over the outlet 60 where the chip components are not influenced directly by the pressure exerted by the chip components 1 dropping from the first storage box 45 preventing the chip components 1 from being jammed in the outlet 60 and for allowing the chip components 1 around the outlet 60, when pushed up by the pick-up slider 3, to be changed in position for facilitating insertion thereof into a groove 3a of the pick-up slider 3.

Figure 2:
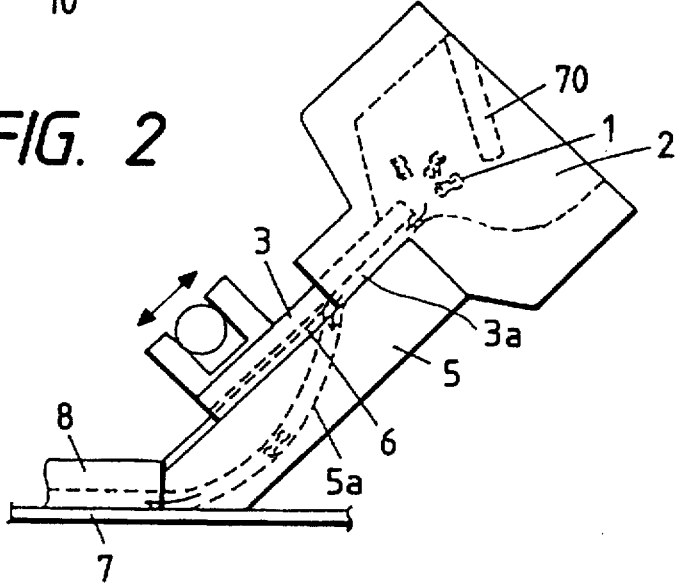
FIG. 2 is a cross sectional view which shows the chip component feeder of FIG. 1.
Figure 3:
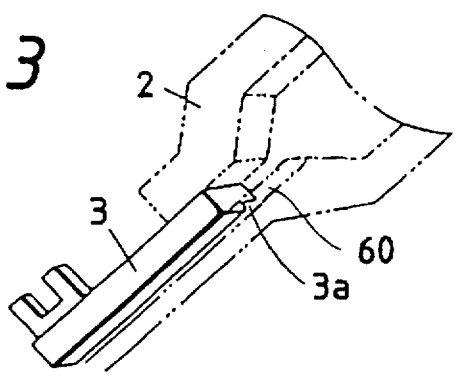
FIG. 3 is a perspective view which shows a pick-up slider entering an outlet of a storage box.

In operation, a V-shaped lever 4 is first moved vertically in a direction, as shown by an arrow B, by an electronic component mounting machine (not shown) to displace the pick-up slider 3 obliquely, as viewed in the drawings through a lever 17. Upon the displacement of the pick-up slider 3, the chip component 1 enters a pick-up path, as can be seen in FIGS. 2, and 3, defined by the groove 3a formed in the pick-up slider 3 and a bottom wall of the outlet 60 of the second storage box 2, and is then fed to the feeding path 5a. While the pick-up slider 3 is practically displaced downward from an upper limit to a lower limit of the sliding path and then returned to the upper limit, it may alternatively be displaced upward from the lower limit to the upper limit and then returned to the lower limit.

According to the movement of the lever 4 in the direction B, a ratchet 10 and a ratchet wheel 9 are rotated intermittently through a connecting lever 11 to move the belt 7 so that the chip components 1 are carried in the direction A. Additionally, the stopper 12 is displaced in a direction, as indicated by an arrow C, according to the movement of the connecting lever 11 and the ratchet 10 to form a gap between the stopper 12 and the chip components 1 so that the chip components 1 are picked up one at a time by a vacuum nozzle 61 of the electronic component mounting machine. The above operations complete one cycle of sequential chip component picking up operations.

Figure 4:
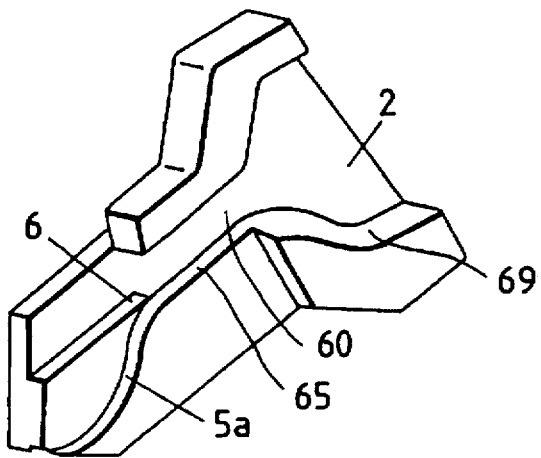
FIG. 4 is a perspective view which shows a sliding path of a pick-up slider leading to an outlet of a storage box.

In the drawings, the reference number 6 denotes a stepped portion higher than an upper sliding surface 65, as clearly shown in FIG. 4, formed In the first feeding unit 5. The stepped portion 6 has a tip portion defining an upper wall of an inlet of the feeding path 5a for guiding insertion of the chip components 1 into the feeding path 5a. The stepped portion 6, as shown in FIG. 2, engages the groove 3a of the pick-up slider 3 when moved up and down. The reference number 13 represents a feeder body. The reference number 14 represents a guiding plate 14 which may be formed integrally with the feeder body 13.

Figure 5:
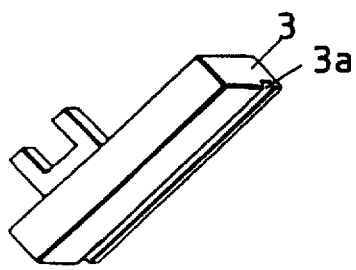
FIG. 5 is a perspective view which shows a modification of the pick-up slider of FIG. 3.

The groove 3a defining the pick-up path leading to the feeding path 5a is, as shown in FIG. 3, formed in a corner of the pick-up slider 3, however, it may alternatively be, as shown in FIG. 5, formed in a bottom wall of the pick-up slider 3. Additionally the sectional shape of the groove 3a may be circular or semicircular according to the shape of the chip components 1.

Figure 6:
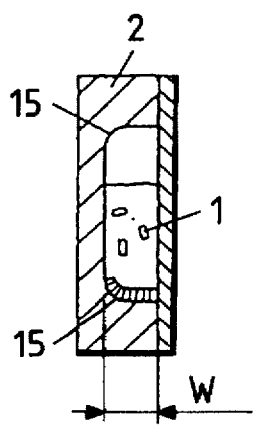
FIG. 6 is a cross sectional view which shows a second storage box.

Inner corners of the second storage box 2 may be, as illustrated at numeral 15 in FIG. 6, rounded or chamfered to prevent the chip components 1 from being locked therein.

Figure 7:
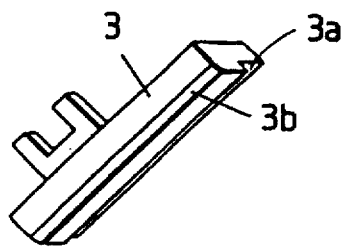
FIG. 7 is a perspective view which shows a modification of the pick-up slider of FIG. 3.

Additionally, a chamfered (or rounded) portion 3b, as shown in FIG. 7, is formed in a corner of the pick-up slider 3 opposite a corner in which the groove 3a may be formed for preventing the chip components 1 around the outlet 60 of the second storage box 2 from being caught between a corner of the pick-up slider 3 and the inner wall of the second storage box 2 when the pick-up slider 3 is lifted up to enter the second storage box 2.

Figure 8:
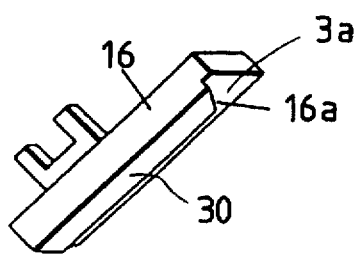
FIG. 8 is a perspective view which shows a pick-up slider according to a second embodiment of the invention.
Figure 9:
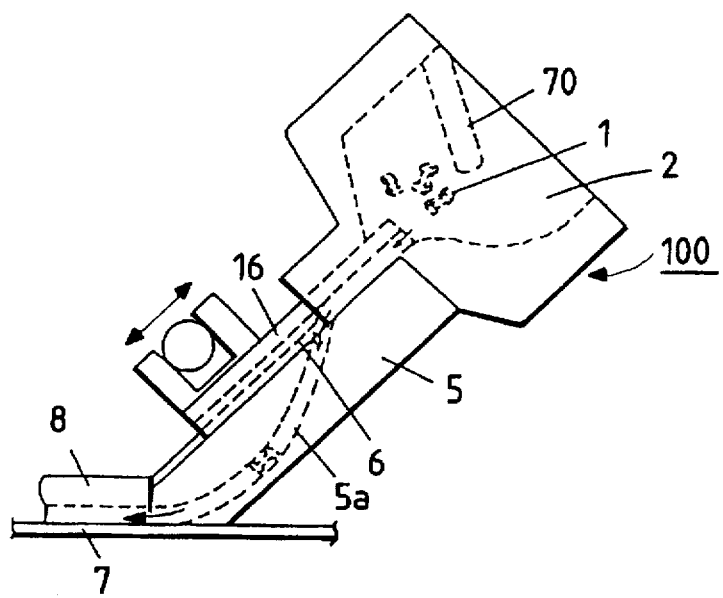
FIG. 9 is a front view which shows a chip component feeder according to a second embodiment.

Referring to FIGS. 8 and 9, there is shown a second embodiment of the chip component feeder 100 of the invention which is different from the above first embodiment only in shape of the pick-up slider, and explanation of the other parts in detail will be omitted here.

FIG. 8 is a perspective view which shows a pick-up slider 16 of the second embodiment which has an inclined or tapered surface 16a formed on an end of a corner portion 30. The tapered surface 16a serves to guide insertion of the chip components 1 into the pick-up path defined by the groove 3a.

When the pick-up slider 16 is, as seen in FIG. 9, moved upward, the chip components 1 in the second storage box 2 are pushed upward. Subsequently, when the pick-up slider 16 is moved downward, the chip components 1 drop into the groove 3a of the pick-up slider 16. The groove 3a, as apparent from FIG. 8, has a large inlet area defined by the tapered surface 16a so that a number of the chip components 1 are led into the groove 3a, thereby allowing the chip components to be supplied at a high speed.

Figure 10:
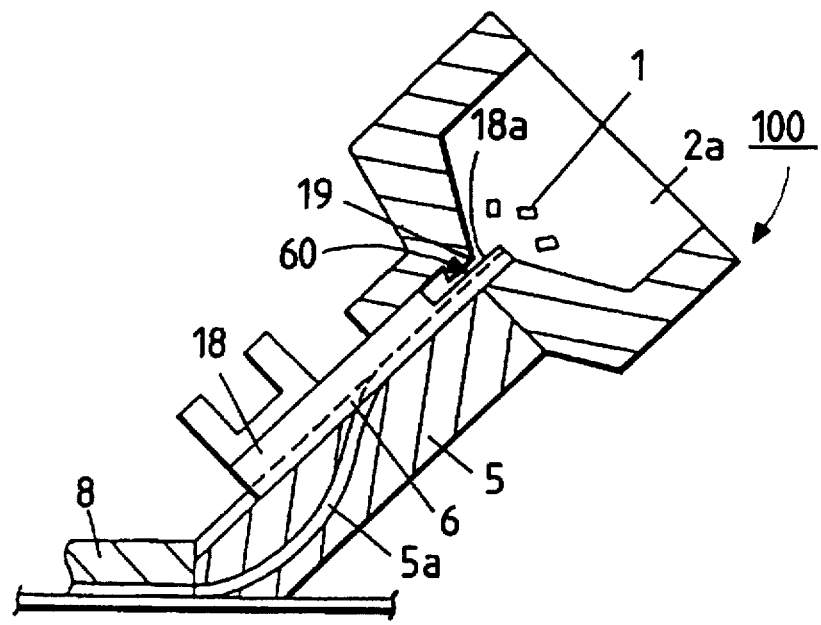
FIG. 10 is a cross sectional view which shows a chip component feeder according to a third embodiment when a pick-up slider reaches an upper limit.
Figure 11:
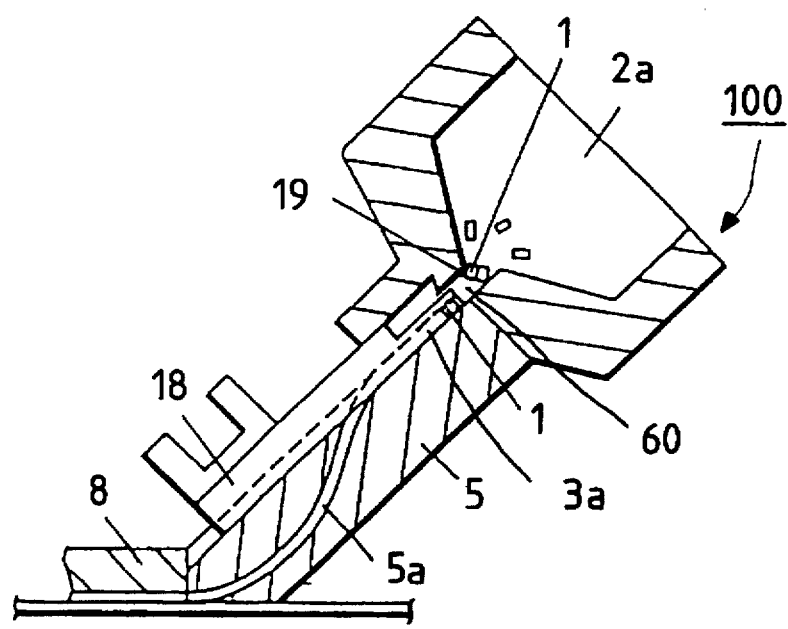
FIG. 11 is a cross sectional view which shows a chip component feeder according to a third embodiment when a pick-up slider reaches a lower limit.

Referring to FIGS. 10 and 11, there is shown a third embodiment of the chip component feeder 100 of the invention which is different from the first embodiment only in shape of the pick-up slider and structure of the second storage box, and explanation of the other parts in detail will be omitted here.

FIG. 10 is a cross sectional view which shows a pick-up slider 18 when located at the upper limit along the sliding path, while FIG. 11 shows the pick-up slider 18 when located at the lower limit.

The pick-up slider 18, as can be seen in FIG. 10, has formed on its end a stepped portion 18a which is designed to enter the outlet 60 with a small gap between its upper surface and an upper inner wall of the outlet 60. The cross sectional area of the outlet 60 is set less than or equal to twice the thickness of the chip components 1 for preventing the more than two chip components 1 from entering simultaneously. Additionally, the outlet 60, as clearly shown in FIGS. 10 and 11, has a lower inner wall extending inward of the second storage box 2a as compared with the upper inner wall to define an opening of the outlet 60 substantially horizontally. The pick-up slider 18 is so designed that the stepped portion 18a, as shown in FIG. 11, is moved below an upper inner edge 19 of the second storage box 2a (i.e., the opening of the outlet) when the pick-up slider 18 reaches the lower limit for complete insertion thereof into the outlet 60 of the second storage box 2a.

In operation, the pick-up slider 18 is first elevated to push up the chip components 1, as shown in FIG. 10, and then moved downward, as shown in FIG. 11. The pick-up slider 18, when reaching the lower limit, enters the outlet 60 completely, so that of the chip components 1 having fallen around the outlet 60, standing ones and ones having fallen together cannot enter the outlet 60, but allowing only ones having fallen horizontally to enter the groove 3a of the pick-up slider 18 because the cross sectional area of the outlet 60 is set less than or equal to twice the thickness of the chip components 1.

With these arrangements, it is possible to select in the second storage box 2 only ones from the chip components 1 before dropping into the outlet 60, which are oriented to enter the groove 3a of the pick-up slider 18 easily. Thus, the number of the chip components 1 passing through the outlet 60 of the second storage box 2a is decreased, however, the degree of spatial freedom for orientation of the chip components 1 relative to the outlet 60 (i.e., the groove 3a of the pick-up slider 18) is increased. Therefore, the chip component feeder 100 of the second embodiment is useful to increase a supply of the chip components 1 having, especially, a rectangular cross section.

Figure 12:
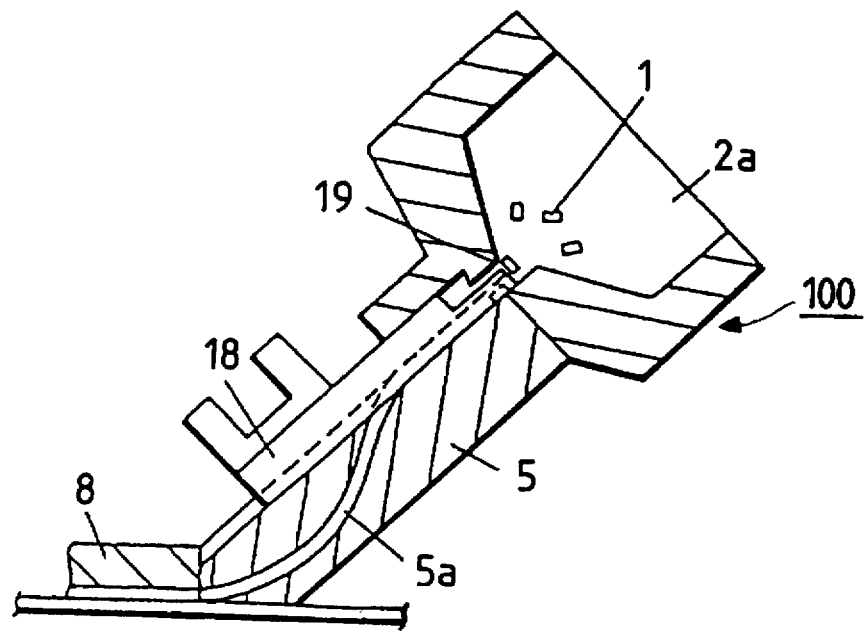
FIG. 12 is a cross sectional view which shows a modification of the chip component feeder in FIGS. 11 and 12.

FIG. 12 shows a modification of the third embodiment. The pick-up slider 18 is designed to be flush with an inner wall of the second storage box 2 around the outlet 60 when it reaches the upper limit. Specifically, the pick-up slider 18 is controlled not to draw back inside a plane extending perpendicular to the sliding path of the pick-up slider 18 through the upper inner edge 19 of the outlet 60 when it reaches the lower limit. This arrangement prevents the chip components 1 from being caught in the opening of the outlet 60, and is suitable for circular or square chip components.

Referring to FIGS. 13, 14, 15, and 16, there is shown a fourth embodiment of the chip component feeder 100 of the invention which is different from the third embodiment only in structure of the first feeding unit and the pick-up slider.

Figure 13:
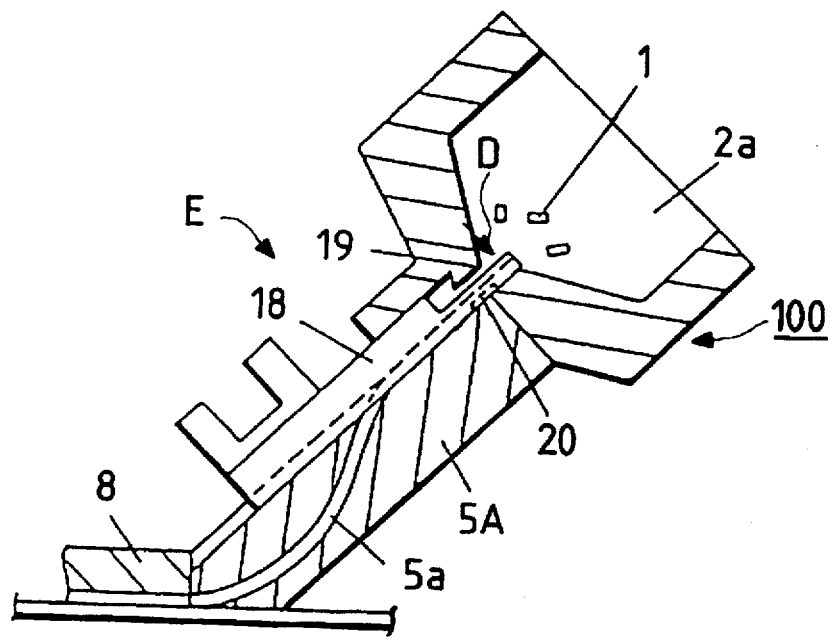
FIG. 13 is a cross sectional view which shows a chip component feeder according to a fourth embodiment when a pick-up slider reaches an upper limit.
Figure 14:
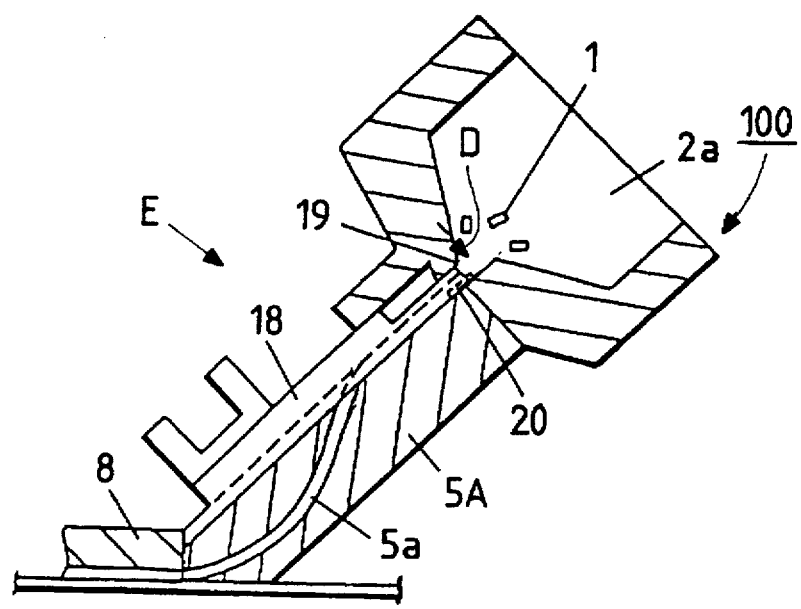
FIG. 14 is a cross sectional view which shows a chip component feeder according to a fourth embodiment when a pick-up slider reaches a lower limit.

FIG. 13 shows is a cross sectional view which shows the chip component feeder 100 when the pick-up slider 18 reaches the upper limit, while FIG. 14 shows the chip component feeder 100 when the pick-up slider 18 reaches the lower limit. Additionally, FIGS. 15 and 16 show the pick-up slider 18 as viewed from the direction E in FIGS. 13 and 14, respectively.

Figure 16:
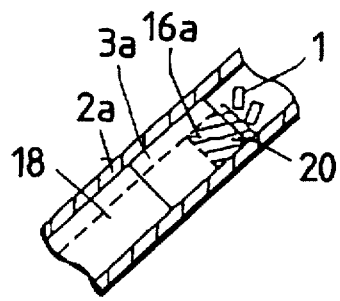
FIG. 16 is an illustration, as viewed from a direction E in FIG. 14, which shows a sliding path when a pick-up slider reaches a lower limit.

The first feeding unit 5A has formed on its upper sliding surface 65 in the outlet 60 a rectangular protrusion 20 which is, as shown in FIG. 16, arranged so as to project partially from the tapered surface 16a of the pick-up slider 18 when the pick-up slider 18 reaches the upper limit. The pick-up slider 18 has formed in its bottom wall a recessed portion for receiving the protrusion 20 during sliding movement.

Figure 15:
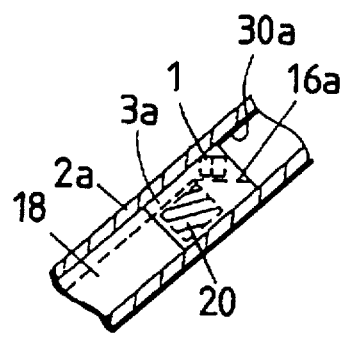
FIG. 15 is an illustration, as viewed from a direction E in FIG. 14, which shows a sliding path when a pick-up slider reaches an upper limit.

When the pick-up slider 18 slides up and down, the chip components 1, as shown in FIG. 15, may be caught between an inner wall 30a of the outlet 60 and the tapered surface 16a of the pick-up slider 18. In the arrangement of this embodiment, however, when the pick-up slider 18 slides downward, as shown in FIG. 16, it will cause the caught chip components 1 to be discharged by the protrusion 20 out of the tapered surface 16a of the pick-up slider 18. Additionally, since when the pick-up slider 18 reaches the lower limit, the end thereof, as shown in FIG. 16, is located at a given interval away from an upper end of the protrusion 20, it is possible to provide a shock to the chip components 1 caught in the outlet 60 to push them into the second storage box 2a when the pick-up slider 18 is lifted upward again.

Figure 17:
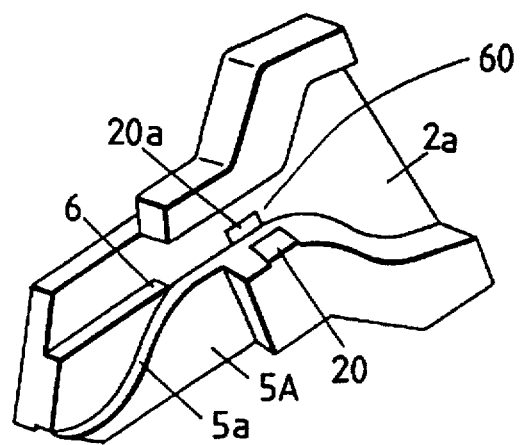
FIG. 17 is a perspective view which shows a modification of a sliding path on which an additional protrusion is mounted.

FIG. 17 shows a modification of the fourth embodiment which has a second protrusion 20a formed at a location on the inner wall of the outlet 60 which corresponds to the groove 3a of the pick-up slider 18. The second protrusion 20a serves to orient the chip components 1 falling from the second storage box 2a toward the groove 3a of the pick-up slider 18 for preventing the chip components 1 to be caught in the outlet 60.

Figure 18:
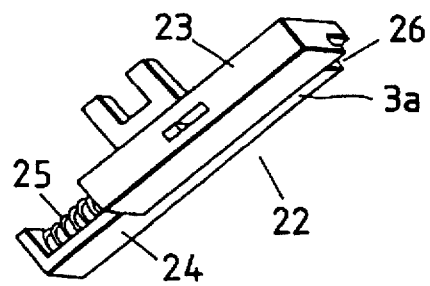
FIG. 18 is a perspective view which shows a pick-up sliding unit according to a fifth embodiment of the invention.
Figure 19:
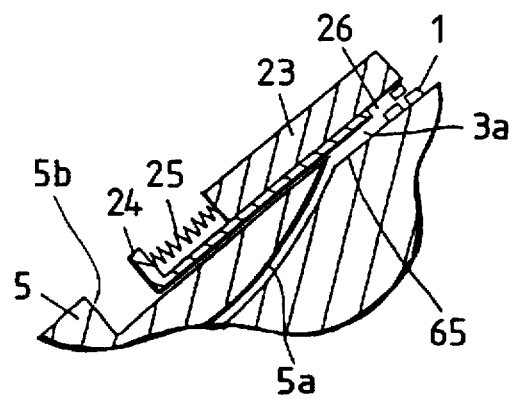
FIG. 19 is a cross sectional view which shows a pick-up sliding unit when it reaches an upper limit.
Figure 20:
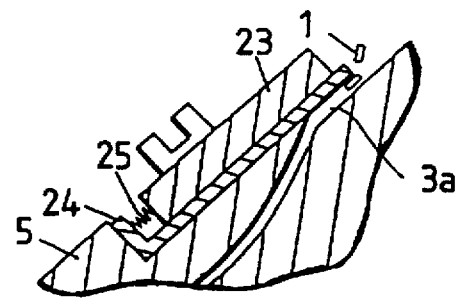
FIG. 20 is a cross sectional view which shows a pick-up sliding unit when it reaches a lower limit.
Figure 21:
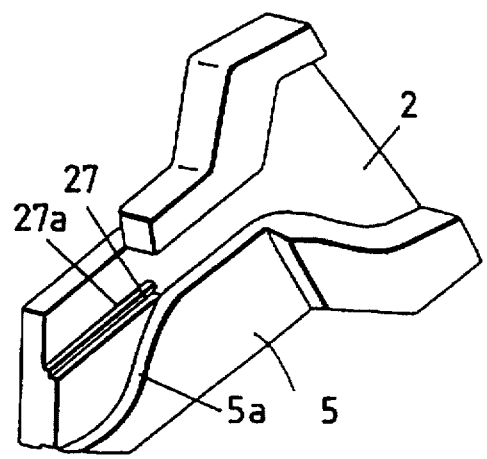
FIG. 21 is a perspective view which shows a sliding path according to a sixth embodiment of the invention.

Referring to FIGS. 18 to 20, there is shown a fifth embodiment of the chip component feeder 100 of the invention which is different from the above embodiments only in that a pick-up sliding unit 22 is provided in place of the pick-up slider. Other arrangements are identical, and explanation thereof in detail will be omitted here.

The pick-up sliding unit 22 includes a casing or sliding member 23, a base plate 24, and a coil spring 25. The bottom of the sliding member 23, as clearly shown in FIG. 18, partially covers the bottom of the base plate 24 to form the groove 3a together with an upper wall 65 of the first feeding unit 5 leading to the feeding path 5a. The sliding member 23 is retained by the coil spring 25 so as to project partially from a front end of the base plate 24 to define an inlet 26 greater in cross sectional area than the groove 3a.

In operation, when the pick-up sliding unit 22 is moved downward and the lower end of the base plate 24 is brought into engagement with an end wall 5b of the sliding path (i.e., the lower limit), the sliding member 23 is further moved downward against a spring force of the coil spring 25 so that the front end of the base plate 24, as shown in FIG. 20, projects from the sliding member 23 to discharge the chip components 1 caught in the inlet 26 therefrom. The chip components 1 drop into the groove 3a during a time when the pick-up sliding unit 22 is lifted upward and then stops at the upper limit.

Referring to FIGS. 21 to 25, there is shown a sixth embodiment of the chip component feeder 100 which is different from the above embodiments only in structure of the stepped portion 27.

Figure 22:
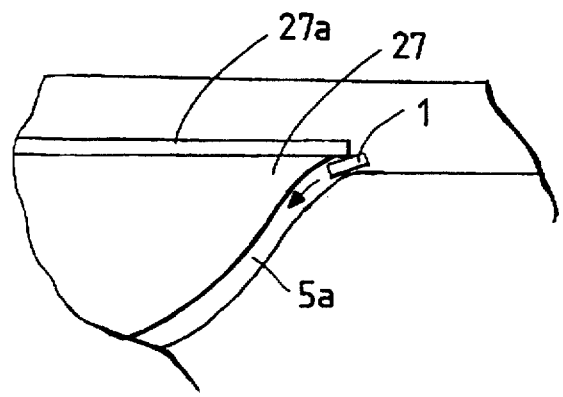
FIG. 22 is a partial view which shows a second stepped portion serving to guide insertion of a chip component into a feeding path.
Figure 23:
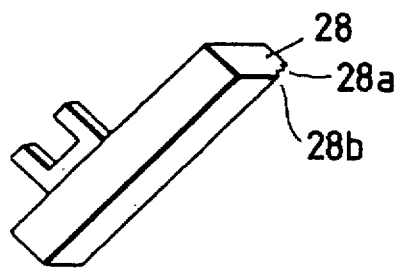
FIG. 23 is a perspective view which shows a pick-up slider according to a sixth embodiment.
Figure 24:
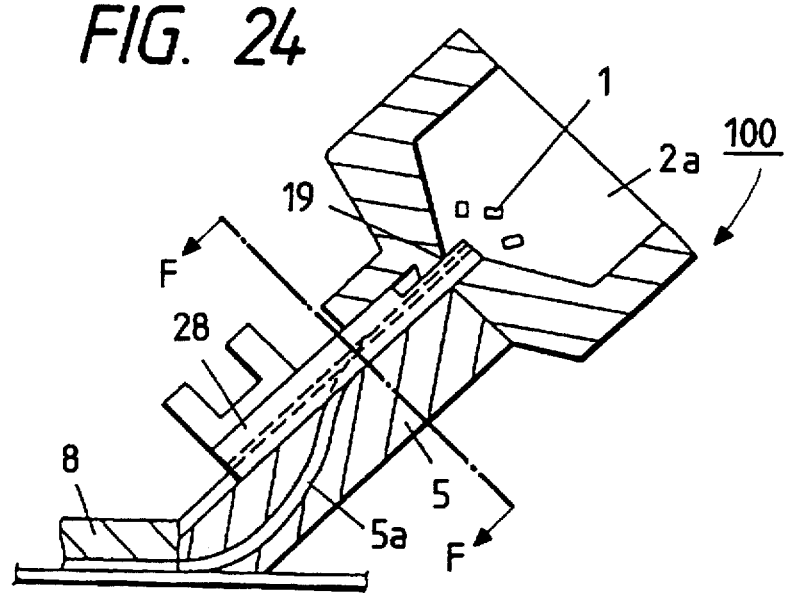
FIG. 24 is a cross sectional view which shows a chip component feeder when a pick-up slider reaches an upper limit.
Figure 25:
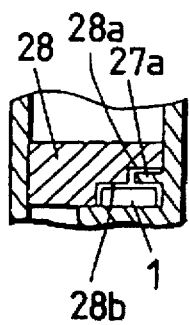
FIG. 25 is a cross sectional view taken along the line F in FIG. 24.

The first feeding unit 5 includes the stepped portion 27 which has, as clearly shown in FIG. 22 and 25, formed thereon a second stepped portion 27a whose front end projecting over the inlet of the feeding path 5a to orient insertion of the chip component 1 into the feeding path 5a. The pick-up slider 28, as shown in FIGS. 23 and 25, includes a higher stepped groove 28a and a lower stepped groove 28b. The lower stepped groove 28b defines a groove leading to the feeding path 5a of the first feeding unit 5.

In FIG. 10, for example, when the pick-up slider 18 is moved up and down, the chip components 1 usually drop into the groove 3a sequentially. They, however, in rare cases, may be caught in the inlet of the feeding path 5a. In this embodiment, the front end of the second stepped portion 27a orients insertion of the chip components 1 into the feeding path 5a.

Figure 26:
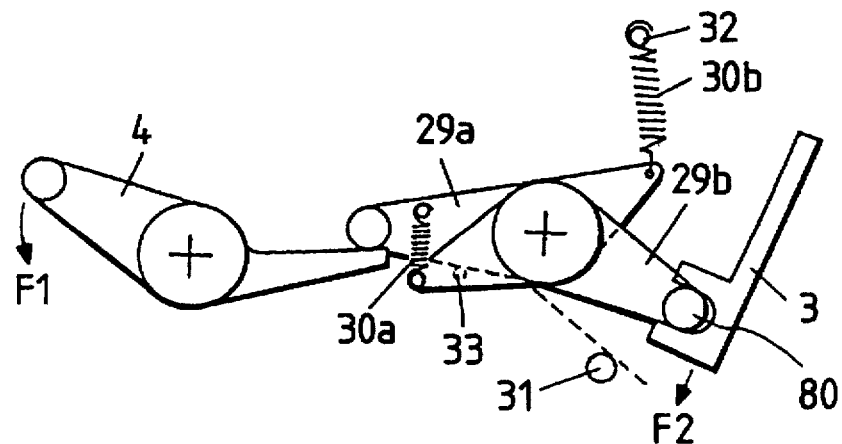
FIG. 26 is a front view which shows a sliding mechanism for sliding a pick-up slider according to a seventh embodiment of the invention.

Referring to FIG. 26, there is shown a sliding mechanism for the pick-up slider 3 according to the seventh embodiment of the invention.

The sliding mechanism includes a lever 4, intermediate levers 29a and 29b, a tension spring 30a connecting between the intermediate levers 29b and 29b, a stopper 31 defining a lower limit of swing motion of the intermediate lever 29b, a pin 32, a tension spring 30b connecting between the intermediate lever 29b and the pin 32, and a pin 33 mounted on the intermediate lever 29b. The intermediate lever 29b has a shaft 80 engaging the pick-up slider 3. The stopper 31 and the pin 32 are secured on a guide plate (not shown).

In operation, when the electronic component machine moves the lever 4 downward (in a direction F) for sliding the pick-up slider 3, the intermediate lever 29a rotates clockwise, as viewed in the drawing, so that the intermediate lever 29b rotates with the aide of a tensioning force of the tension spring 30a. This causes the pick-up slider 3 to move downward (in a direction F2). The intermediate lever 29b engages the stopper 31 to restrict the downward movement of the pick-up slider 3. When the lever 4 is returned to an initial position, a tensioning force of the tension spring 30b acts on the intermediate lever 29a so that it rotates counterclockwise, and the pin 33 pushes the intermediate lever 29b, thereby causing the pick-up slider 3 to be lifted upward.

With the above arrangements, even if an unwanted violent force acts on the pick-up slider 3, it is absorbed by the tensioning force of the tension spring 30a or 30b, thereby preventing the chip components 1 from being damaged.

Figure 27:
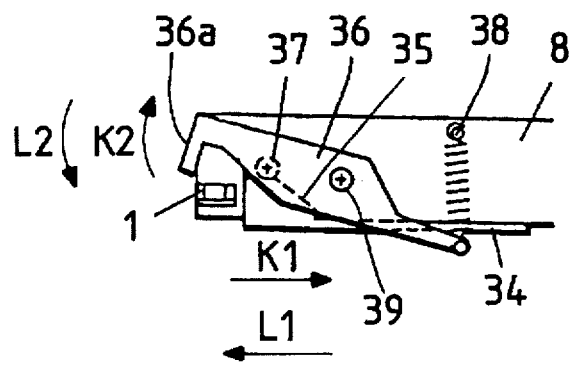
FIG. 27 is a front view which shows a pick-up mechanism mounted on a pick-up station on a second feeding unit according to an eighth embodiment of the invention.

Referring to FIG. 27 there is shown a pick-up mechanism according to the eighth embodiment of the invention which is arranged at the end of the belt 7 (i.e., the second feeding unit).

The pick-up mechanism includes a shutter 34, an inclined cam surface 35 formed on the shutter 34, a stopper 36, a roller 37 secured on the stopper 36, and a tension spring 38 hung over the cover 8 and the stopper 36. The stopper 36 is supported pivotably about a shaft 39 mounted on the cover 8. The shutter 34 is connected to the connecting lever 11, as shown in FIG. 1.

In operation, when the connecting lever 11 is displaced to move the shutter 34 in a direction K1, the stopper 36 rotates clockwise (i.e., direction K2) along the cam surface 35 to open an end member 36a of the stopper 36 so that the chip component 1 on the belt 7 is exposed outside. A vacuum unit (not shown) similar to the one shown in FIG. 1 then draws the chip component 1 from the belt 7. When the shutter 34 is moved in a direction L1, the stopper 36 is rotated in a direction L2 by a tensioning force of the tension spring 38 and then returned back to its initial position. Different types of chip components may be picked up by changing the cam surface 35.

Figure 28:
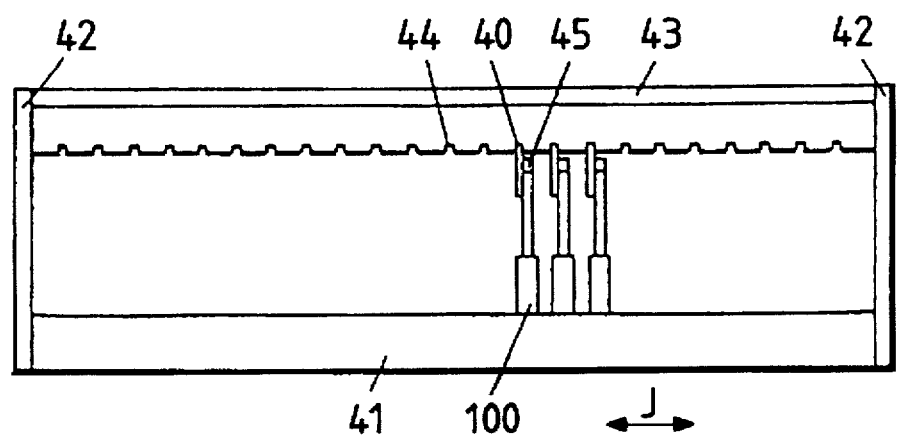
FIG. 28 is a front view which shows a plurality of chip component feeders mounted on a chip component supply table according to the ninth embodiment of the invention.
Figure 32:
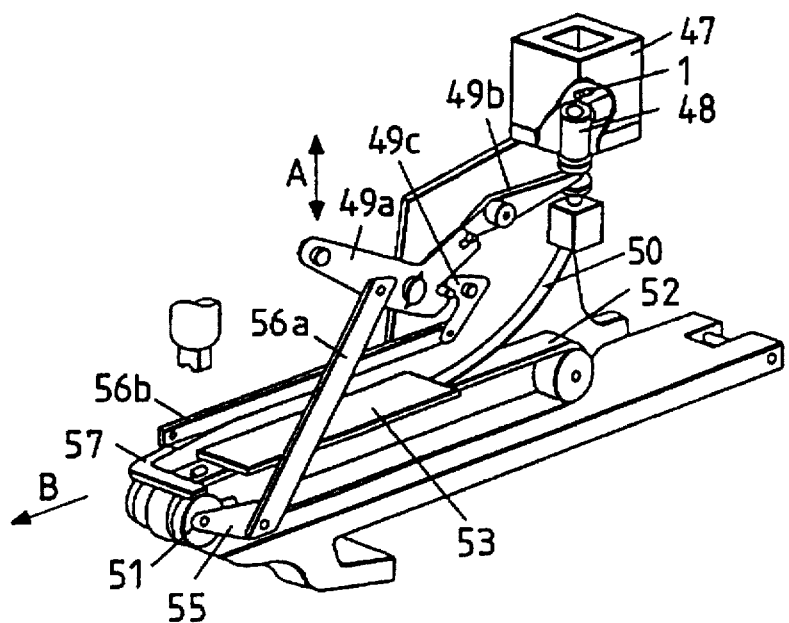
FIG. 32 is a perspective view which shows a conventional chip component feeder.
Figure 33A:
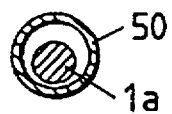
FIGS. 33(a), 33(b), and 33(c) are cross sectional views which show the chip components in FIGS. 31(a) to 31(c) being fed through a feeding path.
Figure 33B:
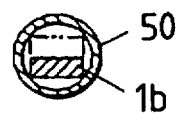
Figure 33C:
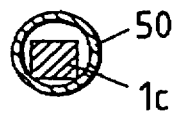

Referring to FIG. 28 to 30, there is shown a ninth embodiment of the invention. FIG. 28 shows a plurality of the chip component feeders 100 (e.g., 150 feeders) mounted on an electronic component mounting machine. FIG. 29 is a plan view of FIG. 28.

The chip component feeders 100 are installed on a supply table 41 of the electronic component mounting machine. Connecting members 40 are secured on upper portions of the chip component feeders 100 and are practically fitted into grooves 44 formed in a bar 43 at regular intervals so that the chip component feeders 100 may be arranged side by side. Side plates 42 are attached to the supply table 41. The bar 43 is supported by the side plates 42.

In operation, the supply table 41 is displaced in directions J under NC control to select one of the chip component feeders 100 to be used. Some prior art systems experience a difficulty in that during displacement of a supply table, chip component feeders will be shaken laterally, causing the chip components to be jumped out of a storage box, resulting in the color being faded out of the chip components. In this embodiment, the chip component feeders 100 are, as discussed above, retained by the grooves 44 formed in the bar 43, thereby absorbing vibrations of the chip component feeders 100 during the displacement of the supply table 41. This ensures the quality of the chip components 1 and improves the reliability of the chip component feeders 100.

Additionally, a holder 46 shown in FIG. 30 may be provided to retain the first storage box 45 firmly on the chip component feeder 100 to enhance the above mentioned effects.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims. For example, two assemblies composed of the first and second storage boxes and the first and second feeding units may be mounted on the chip component feeder.

What is claimed is:

1. A chip component feeding apparatus comprising:

a storage member having formed therein a storage chamber for storing therein chip components, the storage chamber having an outlet formed in a lower portion thereof;

a first feeding unit having formed therein a feeding path for feeding the chip components stored in the storage chamber of said storage means, the feeding path having a rectangular cross section;

a pick-up slider sliding between an upper limit leading to the outlet of said storage member and a lower limit along a given sliding path defined on said first feeding unit including groove means to pick up and carry the chip components stored in the storage chamber of said storage member and lead the picked up chip components into the feeding path of said first feeding unit as said pick-up slider moves between said upper and lower limits; and a second feeding unit for moving the chip components through the feeding path of said first feeding unit to a pick-up station.

2. A chip component feeding apparatus as set forth in claim 1, wherein said storage member is geometrically oriented to lead the chip components to the outlet.

3. A chip component feeding apparatus as set forth in claim 2, wherein the feeding path of said first feeding unit is sized to prevent the more than two chip components from being inserted thereinto while overlapping with each other.

4. A chip component feeding apparatus as set forth in claim 3, wherein the feeding path has a height which is less than twice the thickness of the chip components.

5. A chip component feeding apparatus as set forth in claim 1, further comprising a partition member within said storage member to define a space over the outlet for preventing the weight of the chip components in an upper portion of the storage chamber from acting directly on the chip components around the outlet.

6. A chip component feeding apparatus as set forth in claim 1, further comprising a drive unit connecting with said pick-up slider and said second feeding unit, said drive unit synchronously driving said pick-up slider along the given sliding path and said second feeding unit to feed the chip components to the pick-up station.

7. A chip component feeding apparatus as set forth in claim 6, wherein said drive unit includes a lever, a first intermediate lever connecting with the lever, and a second intermediate lever connecting with the first intermediate lever through a spring, the second intermediate lever connecting at its end with said pick-up slider and being moved by the lever through the first intermediate lever and the spring.

8. A chip component feeding apparatus as set forth in claim 1, wherein said pick-up slider has an end portion entering the outlet of said storage member according to the sliding movement, the end portion having formed thereon a tapered surface defining a chip component inlet opening together with an end of the groove.

9. A chip component feeding apparatus as set forth in claim 1, wherein said pick-up slider has a length an end portion of which enters the outlet of said storage member according to the sliding movement of the pick-up slider and which is stepped to have a decreased thickness.

10. A chip component feeding apparatus as set forth in claim 1, wherein the outlet of said storage member is sized to prevent the more than two chip components from being inserted thereinto while overlapping with each other.

11. A chip component feeding apparatus as set forth in claim 1, wherein said pick-up slider, when reaching the lower limit, defines an outlet chamber in the outlet of said storage member for dropping thereinto the chip components which are in a given position.

12. A chip component feeding apparatus as set forth in claim 1, wherein said pick-up slider has an end portion entering the outlet of said storage member according to the sliding movement, the end portion being flush with an inner wall of the storage chamber around the outlet when the pick-up slider reaches the lower limit.

13. A chip component feeding apparatus as set forth in claim 1, further comprising a protrusion formed on the given sliding path of said pick-up slider for preventing the chip components from being locked in the given sliding path.

14. A chip component feeding apparatus as set forth in claim 1, wherein said pick-up slider is formed with a square member having a given length, the groove being formed in a first corner portion of the square member, a chamfered or rounded portion being formed on a second corner portion opposite the first corner portion.

15. A chip component feeding apparatus as set forth in claim 1, wherein said pick-up slider includes a base member, a sliding member, and a spring, the sliding member being slidably mounted on the base member and spring-loaded by the spring.

16. A chip component feeding apparatus as set forth in claim 1, wherein the feeding path of said first feeding unit has a cross sectional area greater than a diagonal of the chip components having a substantially cubic shape, and has a flat bottom surface.

17. A chip component feeding apparatus as set forth in claim 1, further comprising an extension formed on the sliding path of said pick-up slider which extends over the inlet of the feeding path to orient insertion of the chip components into the feeding path.

18. A chip component feeding apparatus as set forth in claim 1, further comprising a pick-up unit disposed at the pick-up station, the pick-up unit including a lever, a sliding member, and a stopper, the stopper being arranged to retain the chip components fed by the second feeding unit at the pick-up station and being rotated by the sliding member according to movement of the lever to release the retaining of the chip components for providing access to the chip components.

19. A chip component feeder moving assembly comprising:

a plurality of chip component feeders including, (a) a storage member having formed therein a storage chamber for storing therein chip components and geometrically oriented to lead the chip components to an outlet formed in a lower portion of the storage member, (b) a first feeding unit having formed therein a feeding path having a rectangular cross section for feeding the chip components stored in the storage chamber of said storage means, (c) a pick-up slider sliding between an upper limit leading to the outlet of said storage member and a lower limit along a given sliding path defined on said first feeding unit including groove means to pick up and carry the chip components stored in the storage chamber of said storage member and leading the picked up chip components into the feeding path of said as said pick-up slider moves between said upper and lower limits, and (d) a second feeding unit for moving the chip components through the feeding path of said first feeding unit to a pick-up station;

a base table mounting thereon said plurality of the chip component feeders; and a feeders holding member supported on said base table, said feeder holding member for holding said plurality of the chip component feeders side by side.

20. A chip component feeder moving assembly as set forth in claim 19, wherein said feeder holding member includes a bar member having formed therein a plurality of grooves each retaining one of said chip component feeders.

\* \* \* \* \*